United States Patent
Young et al.

(10) Patent No.: US 12,375,083 B2
(45) Date of Patent: Jul. 29, 2025

(54) SUPERCONDUCTING PHASE-CHANGE MATERIAL SWITCH

(71) Applicant: NORTHROP GRUMMAN SYSTEMS CORPORATION, Falls Church, VA (US)

(72) Inventors: Robert Miles Young, Ellicott City, MD (US); Aurelius L. Graninger, Sykesville, MD (US); Dustin Ray Johnson, Severna, MD (US); Justin C. Hackley, Catonsville, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 62 days.

(21) Appl. No.: 18/531,291

(22) Filed: Dec. 6, 2023

(65) Prior Publication Data

US 2025/0192778 A1    Jun. 12, 2025

(51) Int. Cl.
  *H03K 17/92* (2006.01)
  *H10N 60/85* (2023.01)
  *H10N 70/20* (2023.01)

(52) U.S. Cl.
  CPC .......... *H03K 17/92* (2013.01); *H10N 60/855* (2023.02); *H10N 70/231* (2023.02)

(58) Field of Classification Search
  CPC ..................................................... H03K 17/92
  USPC ................................................ 327/527, 528
  See application file for complete search history.

(56) References Cited

U.S. PATENT DOCUMENTS

| | | | |
|---|---|---|---|
| 9,257,647 B2 | 2/2016 | Borodulin et al. | |
| 9,673,392 B2 | 6/2017 | Borodulin | |
| 10,186,742 B2 * | 1/2019 | Sherwin | H01P 1/10 |
| 10,312,580 B1 | 6/2019 | Lan et al. | |
| 10,490,374 B2 * | 11/2019 | Borodulin | H10N 70/253 |
| 10,700,270 B2 * | 6/2020 | Borodulin | H10N 70/061 |

OTHER PUBLICATIONS

Borodulin, et al.: "Operation of a Latching, Low-Loss, Wideband Microwave Phase-Change Switch Below 1 K"; Journal of Low Temperature Physics (2019) 194:273-284; https://doi.org/10.1007/s10909-018-2096-8.

Clarke: "The Proximity Effect Between Superconducting and Normal Thin Films in Zero Field"; Journal de Physique Colloques, 1968, 29 (C2), pp. C2-3-C2-16.?10.1051/jphyscol:1968201?. ? jpa-00213516.

* cited by examiner

*Primary Examiner* — Tomi Skibinski
(74) *Attorney, Agent, or Firm* — Tarolli, Sundheim, Covell & Tummino LLP

(57) ABSTRACT

One embodiment of the invention includes a switch circuit including a first superconducting transmission line, a second superconducting transmission line and a phase-change material switch that is coupled between the first and second superconducting transmission lines. The phase-change material switch includes a switch portion that includes a phase-change material that is superconducting in a first state of the switch portion and blocking in a second state of the switch portion, such that the phase change material switch is configured to propagate an input signal from the first superconducting transmission line to the second superconducting transmission line in the first state, and to prohibit propagation of the input signal from the first superconducting transmission line to the second superconducting transmission line in the second state.

20 Claims, 7 Drawing Sheets

SUPERCONDUCTING PHASE-CHANGE MATERIAL SWITCH

TECHNICAL FIELD

This disclosure relates generally to phase-change material switches, and specifically to phase-change material switches that are superconducting.

BACKGROUND

Switching devices are implemented for a variety of reasons and in a variety of applications. For example, switching devices can be implemented for logic circuit and computing applications, for radio-frequency (RF) signal switching in front-end receiver systems, for RF transmitter systems, or a variety of other applications. Transistor technology has advanced considerably with respect to reduction of size and increase in efficiency. However, transistor switching circuits can still exhibit signal losses from switching and interconnects, can still occupy a sizeable space on a printed circuit board (PCB), and can still consume significant power in maintaining activation of the switches for a given switching configuration. Other switching devices can implement micro-electromechanical systems (MEMS) switches. However, MEMS processing can be expensive, can require specialized packaging constraints, and can still exhibit switching losses and activation power consumption.

SUMMARY

One embodiment of the invention includes a switch circuit including a first superconducting transmission line, a second superconducting transmission line and a phase-change material switch that is coupled between the first and second superconducting transmission lines. The phase-change material switch includes a switch portion that includes a phase-change material that is superconducting in a first state of the switch portion and blocking in a second state of the switch portion, such that the phase change material switch is configured to propagate an input signal from the first superconducting transmission line to the second superconducting transmission line in the first state, and to prohibit propagation of the input signal from the first superconducting transmission line to the second superconducting transmission line in the second state.

Another embodiment of the invention includes a method for fabricating a switch circuit. The method includes forming a first superconducting transmission line, forming a second superconducting transmission line and forming a switch portion having an input side that is coupled to the first superconducting transmission line and an output side that is coupled to the second superconducting transmission line. The switch portion includes a phase-change material that is configured to propagate an input signal from the first superconducting transmission line to the second superconducting transmission line in a first state of the switch portion that corresponds to the phase-change material being in a superconducting state, and to prohibit propagation of the input signal from the first superconducting transmission line to the second superconducting transmission line in a second state of the switch portion that corresponds to the phase-change material being in a blocking state. The method further includes forming an actuation portion that includes a resistive heating material near the switch portion and configured to provide a first heat profile to the phase-change material to toggle the switch portion to the first state and to provide a second heat profile to the phase-change material to toggle the switch portion to the second state.

Another embodiment of the invention includes a switch circuit including a first superconducting transmission line, a second superconducting transmission line; and a phase-change material switch. The phase-change material switch includes a switch portion having an input side that is coupled to the first superconducting transmission line and an output side that is coupled to the second superconducting transmission line. The switch portion includes a phase-change material that is superconducting in a first state of the switch portion and blocking in a second state of the switch portion, such that the phase change material switch is configured to propagate an input signal from the first superconducting transmission line to the second superconducting transmission line in the first state, and to prohibit propagation of the input signal from the first superconducting transmission line to the second superconducting transmission line in the second state. The phase-change material switch further includes an actuation portion near to the switch portion and configured to provide a first heat profile to the phase-change material to toggle the switch portion to the first state and to provide a second heat profile to the phase-change material to toggle the switch portion to the second state.

DETAILED DESCRIPTION

Figure 1:
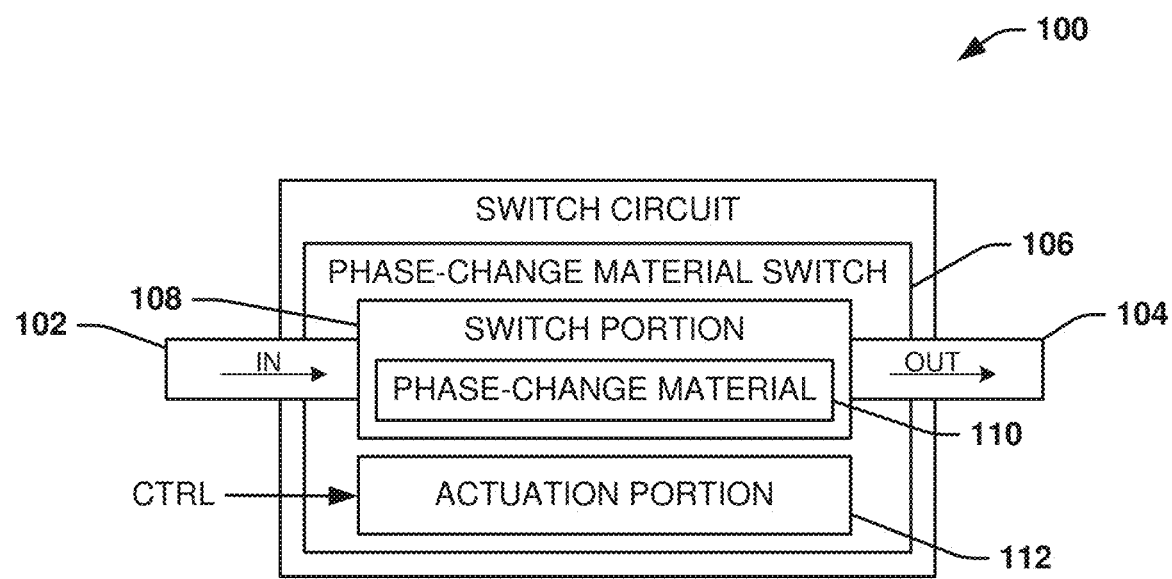
FIG. 1 illustrates an example of a switch circuit.

This disclosure relates to phase-change material switches, and specifically to phase-change material switches that are superconducting. The phase-change material switches include a switch portion and an actuation portion that are near to each other. The switch portion includes a phase-change material that conducts an input signal in a first state of the switch portion and substantially blocks the input signal in a second state of the switch portion. The actuation portion is configured to toggle the switch portion between the first state and the second state. The actuation portion is configured to receive a control signal to generate a heat profile based on the characteristics (e.g., the pulse-width, amplitude etc.) of the control signal. For example, the control signal can have first characteristics (e.g., having a relatively low power and/or a relatively longer pulse) to provide a first heat profile from the actuation portion, and can have second characteristics (e.g., having a relatively high power and/or a relatively shorter pulse) to provide a second heat profile from the actuation portion. The heat profile provided from the actuation portion can set the phase-change material in the switch portion to one of the first state (e.g., a conducting state) and the second state (e.g., a blocking state). In particular, the actuation portion sets the switch portion to the first state based on crystallizing the phase-change material to crystalline physical state responsive to the first heat profile and to the second state based on melting the phase-change material to an amorphous physical state responsive to the second heat profile. Therefore, the input signal that is provided to the switch portion can either be conducted or substantially blocked based on the state of the switch portion.

To facilitate utilizing the phase-change material switches in superconducting circuits, the phase-change material switches be able to exhibit superconductivity, in particular, be able to provide zero resistance to an input signal. To realize a phase-change material switch that exhibits superconductivity, a switch circuit is disclosed herein. The switch circuit includes a phase-change material switch that is coupled between a first superconducting transmission line and a second superconducting transmission line. The phase-change material switch includes a switch portion that includes a phase-change material. The phase-change material switch can be fabricated to be substantially inline (e.g., collinear) with first and the second superconducting transmission lines. In particular, an input side of the switch portion is coupled to the first superconducting transmission line and an output side of the switch portion is coupled to the second superconducting transmission line. In one example, the phase-change material of the switch portion is formed from a superconducting material to facilitate the phase-change material switch to exhibit superconductivity. In another example, the phase-change material of the switch portion is formed from a non-superconducting material to facilitate superconductivity based on the proximity effect. Therefore, coupling the first superconducting transmission line and the second superconducting transmission line proximal to each other can facilitate superconducting of the phase-change material switch in the first state.

Since the phase-change material switch proposed herein is fabricated to be substantially inline (i.e., collinear) with the first and second superconducting transmission lines, the phase-change material switch can occupy a significantly smaller volume on a circuit board than conventional switch configurations. In particular, the phase-change material switch can be microscopic in size and therefore, is compatible with monolithic integration of the superconducting circuits to achieve higher circuit densities. In addition to the increased circuit density and test throughput, the proposed phase-change material switch also permits the design of circuits that operate over a wide range of frequencies, due to the wide bandwidth of phase change material switches in comparison with Josephson junction (JJ)-based switches. The use of phase-change material switches thus results in greater design flexibility that could result in more optimized designs of circuits that require large bandwidths.

FIG. 1 illustrates an example of a switch circuit 100. The switch circuit 100 may be implemented as part of any superconducting circuit. The switch circuit 100 includes a first superconducting transmission line 102 and a second superconducting transmission line 104. The switch circuit 100 further includes a phase-change material switch 106 that is coupled between the first superconducting transmission line 102 and the second superconducting transmission line 104. The phase-change material switch 106 includes a switch portion 108 having an input side that is coupled to the first superconducting transmission line 102 and an output side that is coupled to the second superconducting transmission line 104. The switch portion 108 includes a phase-change material 110. As described herein, a phase-change material (e.g., the phase-change material 110) can be any material that exhibits variable electrical resistivity that is dependent on crystallinity.

In some examples, the phase-change material switch 106 is fabricated such that the switch portion 108 is configured as an inline switch. In particular, the phase-change material 110 is configured to be substantially in-line with the first superconducting transmission line 102 at the input side of the switch portion 108 and the phase-change material 110 is configured to be substantially in-line with the second superconducting transmission line 104 at the output side of the switch portion 108. As an example, the first superconducting transmission line 102 and the second superconducting transmission line 104 can be fabricated with a gap in between, such that the gap is filled with the phase-change material 110 that constitutes the switch portion 108. As a result of the inline configuration, the phase-change material switch 106 does not include separate contacts, unlike conventional transistor and/or micro-electromechanical systems (MEMS) switches, that can occupy additional space and can introduce signal losses from a lack of impedance matching.

The phase-change material 110 is configured to be superconducting in a first state of the switch portion 108 and is configured to be blocking in a second state of the switch portion 108. Therefore, in some examples, the phase-change material switch 106 (in particular, the phase-change material 110) is configured to propagate (e.g., conduct with zero resistance) an input signal IN from the first superconducting transmission line 102 to the second superconducting transmission line 104 in the first state of the switch portion 108 that corresponds to a superconducting state of the phase-change material 110, and to prohibit propagation of the input signal IN from the first superconducting transmission line 102 to the second superconducting transmission line 104 in the second state of the switch portion 108 that corresponds to a blocking state of the phase-change material 110. In some examples, the input signal IN which is propagated from the first superconducting transmission line 102 to the second superconducting transmission line 104 in the first state of the switch portion 108 is provided as an output signal OUT in the second superconducting transmission line 104.

The phase-change material switch 106 further includes an actuation portion 112 near to the switch portion 108 and configured to toggle the switch portion 108 between the first state and the second state. In particular, the actuation portion 112 is configured to provide a first heat profile to the phase-change material 110 to toggle the switch portion 108 to the first state and to provide a second heat profile to the phase-change material 112 to toggle the switch portion 108 to the second state. The actuation portion 112 is configured to receive a control signal CTRL and to provide the first heat profile in response to first characteristics of the control signal CTRL to set the phase-change material 110 to a crystalline physical state to toggle the switch portion 108 to the first state. The actuation portion 112 is configured to provide the second heat profile in response to second characteristics of the control signal CRTL 114 to set the phase-change material 110 to an amorphous physical state to toggle the switch portion 108 to the second state. In some examples, the first state of the switch portion 108 corresponds to the phase-change material 110 being in the crystalline physical state and the second state of the switch portion 108 corresponds to the phase-change material 110 being in the amorphous physical state.

The actuation portion 112 includes, for example, a resistive heating material that exhibits resistivity and a substantially high thermal conductivity. In some examples, the actuation portion 112 includes only a single portion/piece of the resistive heating material. Alternately, in other examples, the actuation portion 112 could include a plurality of portions of the resistive heating material that can be distinct or integral with each other and are arranged adjacent to and/or surrounding the switch portion 108 and that are provided the control signal CTRL substantially concurrently. In some examples, the actuation portion 112 can be formed from niobium (Nb), tungsten (W), platinum (Pt), nickel chromium (NiCr), titanium tungsten (TiW), or any of a variety of similar metal or metal alloys. The actuation portion 112 is arranged substantially near to the phase-change material 110 in the switch portion 108, such that heat that is generated in the actuation portion 112 can be thermally conducted to the phase-change material 110 in the switch portion 108. In this example, the actuation portion 112 is shown to be placed/fabricated below the switch portion 108. However, in other examples, the actuation portion 112 can be placed/fabricated above the switch portion 108, and/or laterally with respect to the switch portion 108. In some examples, the actuation portion 112 and the switch portion 108 are separated by a dielectric material (not shown) to substantially prevent electrical connectivity between the actuation portion 112 and the switch portion 108. The type of dielectric material and the thickness therein can be selected to allow the thermal conductivity from the actuation portion 112 to the switch portion 108, and to allow heat dissipation from the switch portion 108 to an associated substrate (not shown).

In some examples, the phase-change material 110 is formed from a superconducting material. For example, forming the phase-change material 110 from a superconducting material facilitates the phase-change material 110 to be superconducting (e.g., to have zero resistance) in the first state of the switch portion 108. As an example, the superconducting material comprises an alloy of tin telluride (SnTe) and germanium telluride (GeTe). The superconducting material includes at most 70% SnTe and at least 30% GeTe, for example, 64% SnTe and 36% GeTe. Utilizing at most 70% SnTe and at least 30% GeTe can provide for a phase-change material 110 that can be amorphous in the blocking state and crystalline in the superconducting state in cryogenic temperature, and can hold the amorphous physical state at room temperature. More particularly, while 100% SnTe is a phase change material that exhibits superconductivity, 100% SnTe would not hold the amorphous physical state at room temperatures. Therefore, utilizing the alloy of SnTe and GeTe as the phase-change material 110 facilitates the phase-change material 110 to toggle between the crystalline physical state (corresponding to the first state of the switch portion 108) and the amorphous physical state (corresponding to the second state of the switch portion 108), both at room temperature and cryogenic temperatures. Utilizing other superconducting materials other than the alloy of SnTe and GeTe to form the phase-change material 110 are also contemplated to be within the scope of this disclosure.

In other examples, the phase-change material 110 is formed from a non-superconducting material. In such examples, the phase-change material 110 formed from the non-superconducting material is configured to exhibit superconductivity (e.g., conduct in a zero-resistance state) in the first state of the switch portion 108. The phase-change material 110 formed from the non-superconducting material is configured to exhibit superconductivity based on the presence of the first superconducting transmission line 102 and the second superconducting transmission line 104 in accordance with the proximity effect. For example, the Cooper-paired electrons in superconducting materials can penetrate into an electrically conducting but non-superconducting material based on a close proximity of the superconducting materials with respect to each other through the non-superconducting material as a result of the proximity effect. In some examples, the electrons in the superconducting materials are described by a superconducting wavefunction. The region of the non-superconducting material where the superconducting wavefunction has penetrated exhibits superconductivity. The extent to which the superconducting wavefunction penetrates into the non-superconducting material strongly depends on a variety of materials properties of the non-superconducting material, including its resistivity, as well as the cleanliness of the interface between the superconducting and non-superconducting materials.

Therefore, in FIG. 1, when the phase-change material 110 is formed from a non-superconducting material, a first superconducting wavefunction (not shown) associated with the first superconducting transmission line 102 and a second superconducting wavefunction (not shown) associated with the second superconducting transmission line 104 can penetrate into the phase-change material 110 due to the proximity effect. When the switch portion 108 is in the first state, the phase-change material 110 is in the crystalline physical state (e.g., a low resistive state) and therefore, the first superconducting wavefunction and the second superconducting wavefunction penetrates deeper into the phase-change material 110, thereby overlapping each other. When the first superconducting wavefunction and the second superconducting wavefunction overlaps in the first state, the phase-change material 110 will have a continuous portion of region from the first superconducting transmission line 102 to the second superconducting transmission line 104 that exhibits superconductivity, thereby providing superconducting of the phase-change material 110 in the first state of the switch portion 108.

Further, when the switch portion 108 is in the second state, the phase-change material 110 is in the amorphous physical state (e.g., a high resistive state) and therefore, the first superconducting wavefunction and the second superconducting wavefunction penetrates only slightly (e.g., do not penetrate deep) into the phase-change material 110, thereby preventing the first superconducting wavefunction and the second superconducting wavefunction from overlapping each other. Since the first superconducting wavefunction and the second superconducting wavefunction do not overlap in the second state, the phase-change material 110 would not have a continuous stretch of region from the first superconducting transmission line 102 to the second superconducting transmission line 104 that exhibits superconductivity, thereby preventing the phase-change material 110 from superconducting in the second state of the switch portion 108.

In some examples, the switch portion 108 (in particular, the phase-change material 110) has a length $L_{PC}$ that extends between the first superconducting transmission line 102 and the second superconducting transmission line 104 that is short enough to allow superconductivity in the first state of the switch portion 108 and long enough to prevent superconductivity in the second state of the switch portion 108.

Figure 2:
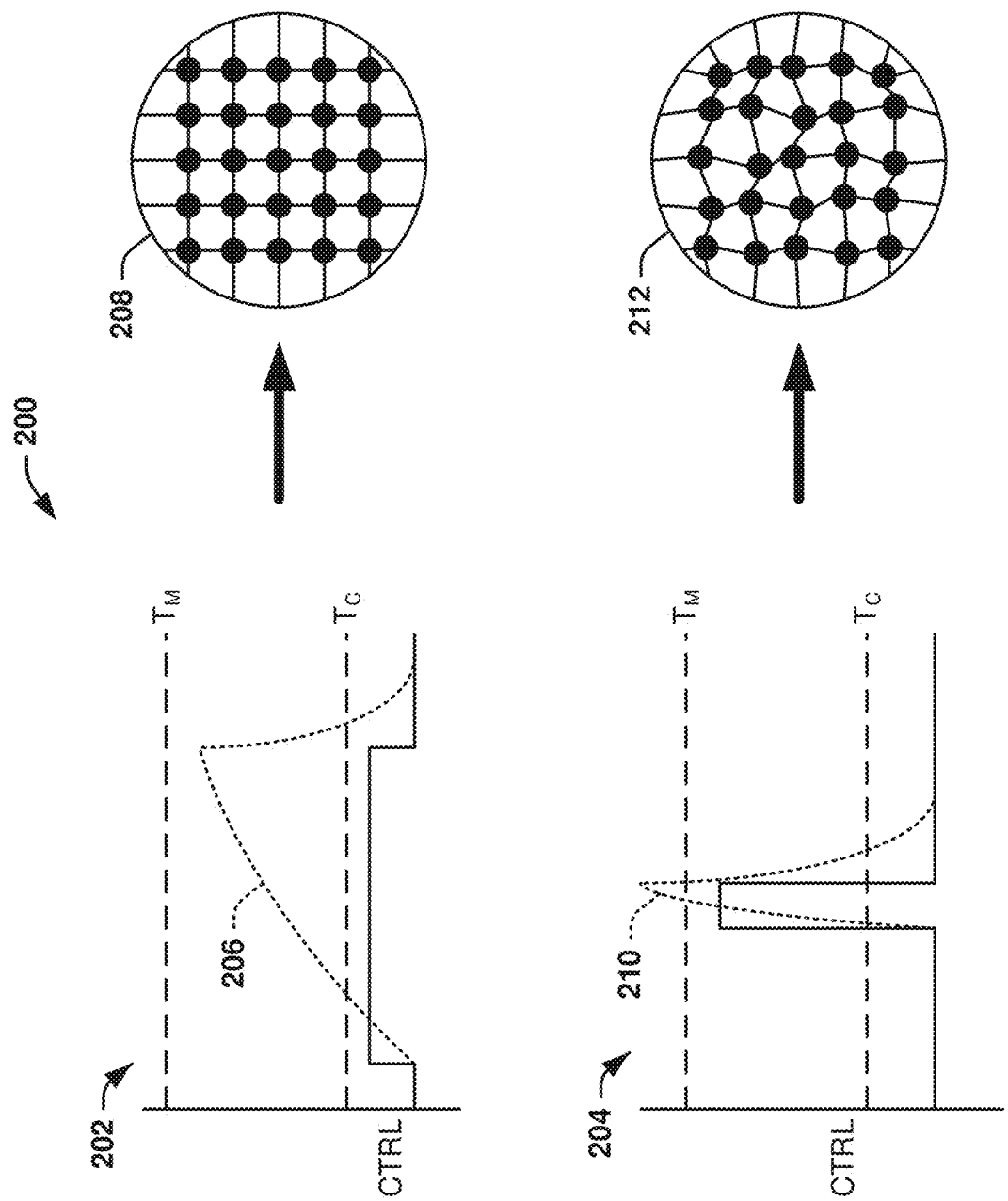
FIG. 2 illustrates an example diagram of states of a phase-change material.

FIG. 2 illustrates an example diagram 200 of states of a phase-change material. The phase-change material in the example of FIG. 2 can correspond to the phase-change material 110 in the example of FIG. 1, and can thus be part of a switch portion of a phase-change material switch, such as the phase-change material switch 106. Therefore, reference is to be made to the example of FIG. 1 in the following description of the example of FIG. 2.

The diagram 200 includes a first state diagram 202 that demonstrates the control signal CTRL (e.g., the control signal CTRL in FIG. 1) having first characteristics and a second state diagram 204 that demonstrates the control signal CTRL (e.g., the control signal CTRL in FIG. 1) having second characteristics. The control signal CTRL having first characteristics is demonstrated in the first state diagram 202 as a pulsed signal having pulse characteristics of a substantially lower amplitude and a substantially longer pulse width relative to the control signal CTRL having second characteristics in the second state diagram 204, which has a substantially high amplitude and a substantially shorter pulse width. The pulse characteristics of the control signal CTRL in each of the first state diagram 202 and the second state diagram 204 can be selected to provide a desired heat profile sufficient to achieve one of crystallization and melting of the phase-change material 110 to a respective one of a crystalline physical state and an amorphous physical state, as described herein, while maintaining sufficiently rapid switching characteristics of the switch portion 108.

In response to the application of the control signal CTRL having first characteristics to the actuation portion 112, as demonstrated in the first state diagram 202, the actuation portion 112 generates/emits a first heat profile 206 that corresponds to a temperature that is conducted to the phase-change material 110 in the switch portion 108 relative to a crystallization temperature $T_C$ and a melting temperature $T_M$. Thus, the first heat profile 206 provides that the temperature conducted to the phase-change material 110 as being greater in amplitude than the crystallization temperature $T_C$, but less than the melting temperature $T_M$, and which remains greater than the crystallization temperature $T_C$ for a time sufficient to crystallize the phase-change material 110, such as similar to an annealing process. In the example of FIG. 2, the crystallization of the phase-change material 110 is demonstrated at 208, which demonstrates the molecules of the phase-change material 110 arranged in a substantially crystalline (i.e., crystal lattice) structure. Therefore, the phase-change material 110 can be substantially conductive of electrical signals (e.g., be in a low resistive state), such as the input signal IN in the example of FIG. 1. For example, the phase-change material 110 can have a conductivity that is approximately four orders of magnitude (i.e., $10^4$) or greater in the crystalline physical state than in the amorphous physical state. Accordingly, in response to application of the control signal CTRL having first characteristics to the actuation portion 112 of the phase-change material switch 106, as demonstrated in the first state diagram 202, the switch portion 108 can be set to the first state.

In response to the application of the control signal CTRL having second characteristics to the actuation portion 112, as demonstrated in the second state diagram 204, the actuation portion 112 generates/emits a second heat profile 210 that corresponds to a temperature that is conducted to the phase-change material 110 in the switch portion 108 relative to the crystallization temperature $T_C$ and the melting temperature $T_M$. Thus, the second heat profile 210 provides that the temperature conducted to the phase-change material 110 as being greater in amplitude than the melting temperature $T_M$, and which decays substantially rapidly after the falling-edge of the pulse of the control signal CTRL, such as based on characteristics of the dielectric material that separates the switch portion 108 and the actuation portion 112 in the phase-change material switch 106. As a result of being heated above the melting temperature $T_M$, followed by rapid temperature decay to below the crystallization temperature $T_C$, the phase-change material 110 melts and solidifies into the amorphous physical state. The rapid temperature decay to below the crystallization temperature $T_C$ does not allow enough time for the molecules of the phase-change material 110 of the switch portion 108 to arrange into the crystalline physical state 208, such as based on selection of a sufficient dielectric material to thermally conduct heat from the phase-change material 110. In the example of FIG. 2, the amorphous physical state of the phase-change material 110 is demonstrated at 212, which shows the molecules of the phase-change material 110 arranged in an amorphous structure. Therefore, the phase-change material 112 can be substantially blocking of electrical signals (e.g., being in a high resistive state), such as the input signal IN in the example of FIG. 1. Accordingly, in response to application of the control signal CTRL having second characteristics to the actuation portion 112 of the phase-change material switch 106, as demonstrated in the second state diagram 204, the switch portion 108 can be set to the second state. The characteristics of the dielectric material, such as with respect to the type of the dielectric material and the thickness therein, can be selected to ensure a substantially rapid dissipation of the heat of the phase-change material 110 to substantially mitigate the recrystallization of the phase-change material 110 subsequent to melting, as described herein.

As demonstrated in the example of FIG. 2, the control signal CTRL is provided as a pulsed signal that implements a single pulse to switch the switch portion 108 of the phase-change material switch 106 between the first state and the second state. Subsequent to the application of the control signal CTRL to the actuation portion 112, the phase-change material 112 remains in the one of the crystalline physical state and the amorphous physical state, such that the switch portion 108 remains in the respective one of the first state and the second state after application of the control signal CTRL. As a result, the phase-change material switch 112 can maintain both the first state and the second state without application of any signal, and can thus operate with significantly less power than typical switches (e.g., transistor and micro-electromechanical systems (MEMS) switches). Further, the switch portion 108 can exhibit significant isolation of the input signal IN (e.g., approximately 50 dB). Furthermore, the phase-change material switch 106 can be fabricated in a compact manner, such that the circuit 100 can include a switch configuration of a plurality of the phase-change material switches 106 that can occupy a substantially smaller circuit area relative to other conventional switch configurations.

Figure 3:
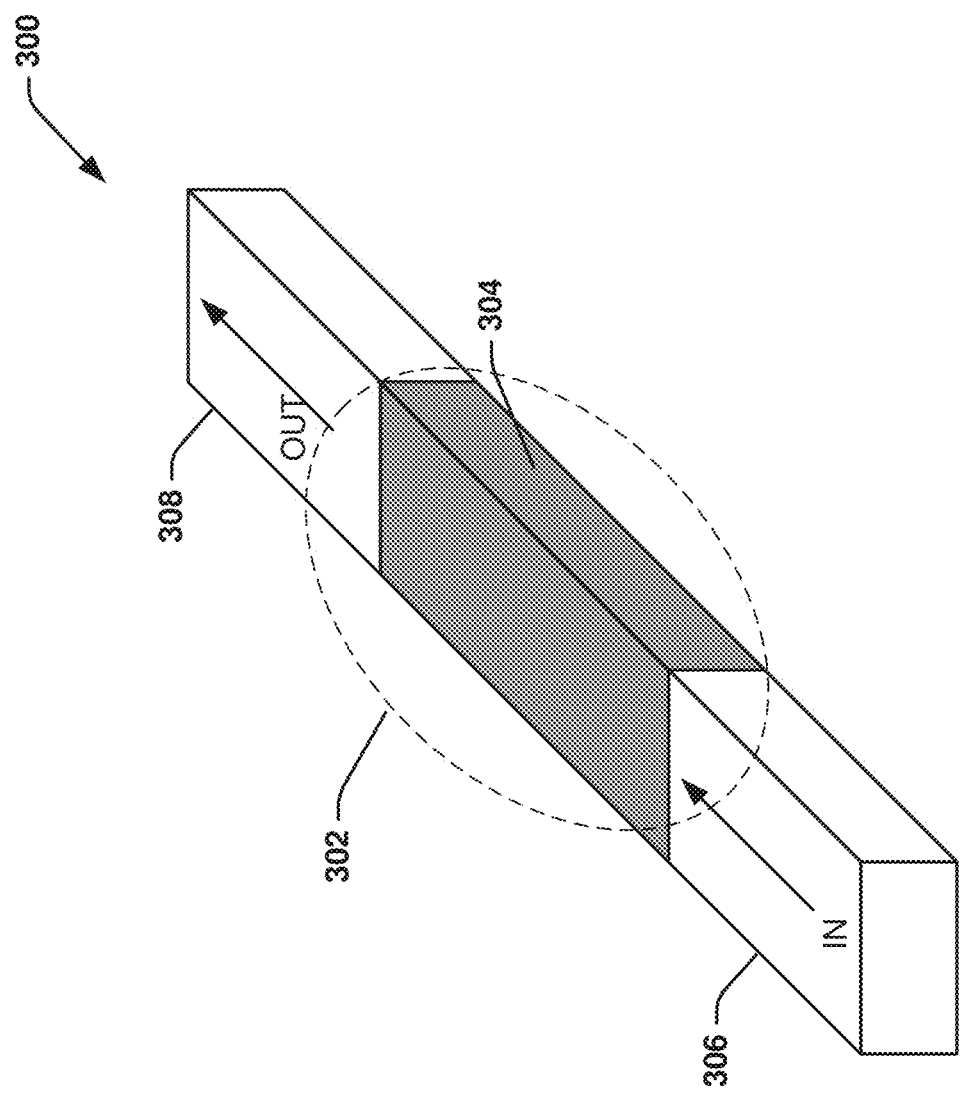
FIG. 3 illustrates an example implementation of a switch circuit.

FIG. 3 illustrates an example implementation of a switch circuit 300. In some examples, the switch circuit 300 corresponds to the switch circuit 100 of FIG. 1 and therefore, all the features of the switch circuit 100 are also applicable herein. The switch circuit 300 includes a phase-change material switch 302 that includes a switch portion 304 that can be fabricated of a phase-change material, such as the phase-change material 112 in the example of FIG. 1. It is to be understood and appreciated that the phase-change material switch 302 can also include an actuation portion, such as the actuation portion 112 in the example of FIG. 1, that is not demonstrated in the example of FIG. 3. In this example, the phase-change material includes a superconducting material, for example, an alloy of tin telluride (SnTe) and germanium telluride (GeTe). The superconducting material includes at most 70% SnTe and at least 30% GeTe. As an example, the superconducting material includes 64% SnTe and 36% GeTe.

The switch circuit 300 further includes a first superconducting transmission line 306 and a second superconducting transmission line 308, and the phase-change material switch 302 is coupled between the first superconducting transmission line 306 and the second superconducting transmission line 308. The phase-change material switch 302 is fabricated such that the switch portion 304 is configured as an inline switch. In particular, the phase-change material (included in the switch portion 304) is configured to be substantially in-line with the first superconducting transmission line 306 at an input side of the switch portion 304 and the phase-change material is configured to be substantially in-line with the second superconducting transmission line 308 at an output side of the switch portion 304.

Figure 4:
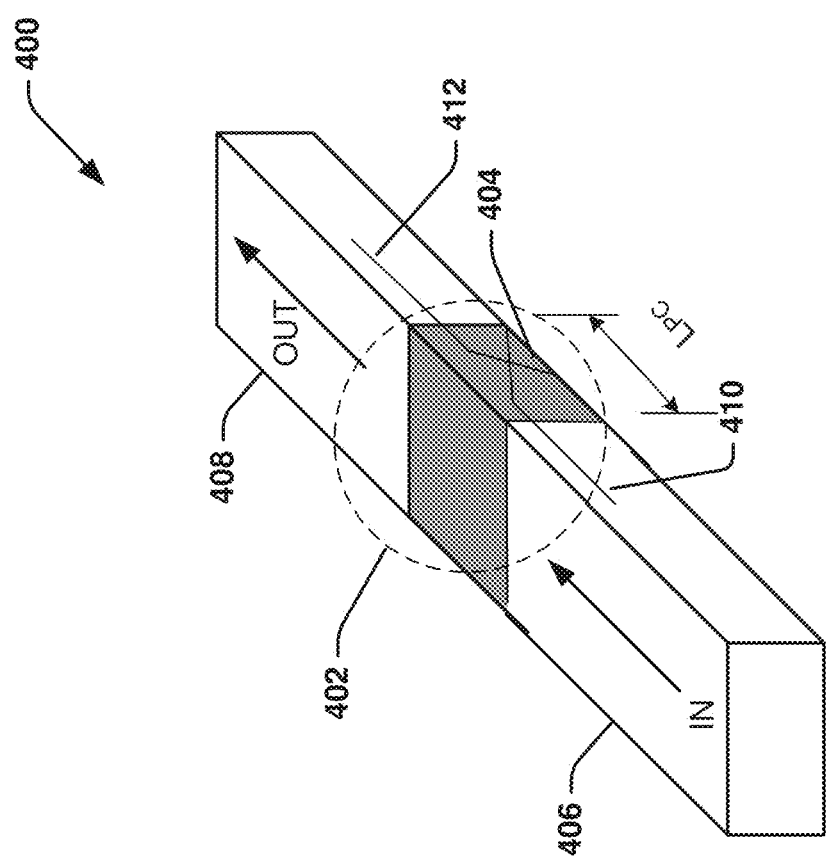
FIG. 4 illustrates another example implementation of a switch circuit.

FIG. 4 illustrates another example implementation of a switch circuit 400. In some examples, the switch circuit 400 corresponds to the switch circuit 100 of FIG. 1 and therefore, all the features of the switch circuit 100 are also applicable herein. The switch circuit 400 includes a phase-change material switch 402 that includes a switch portion 404 that can be fabricated of a phase-change material, such as the phase-change material 112 in the example of FIG. 1. It is to be understood and appreciated that the phase-change material switch 402 can also include an actuation portion, such as the actuation portion 112 in the example of FIG. 1, that is not demonstrated in the example of FIG. 4. In this example, the phase-change material includes a non-superconducting material that is configured to exhibit superconductivity based on the proximity effect.

The switch circuit 400 further includes a first superconducting transmission line 406 and a second superconducting transmission line 408, and the phase-change material switch 402 is coupled between the first superconducting transmission line 406 and the second superconducting transmission line 408. The phase-change material switch 402 is fabricated such that the switch portion 404 is configured as an inline switch. In particular, the phase-change material (included in the switch portion 404) is configured to be substantially in-line with the first superconducting transmission line 406 at an input side of the switch portion 404 and the phase-change material is configured to be substantially in-line with the second superconducting transmission line 408 at an output side of the switch portion 404.

When the phase-change material is formed from a non-superconducting material, a first superconducting wavefunction 410 associated with the first superconducting transmission line 406 and a second superconducting wavefunction 412 associated with the second superconducting transmission line 408 penetrates into the phase-change material due to the proximity effect. When the first superconducting wavefunction 410 and the second superconducting wavefunction 412 penetrates deep enough into the phase-change material to overlap one another, the phase-change material has a continuous portion of region from the first superconducting transmission line 406 to the second superconducting transmission line 408 that exhibits superconductivity, thereby configuring the phase-change material to exhibit superconductivity. However, if the first superconducting wavefunction 410 and the second superconducting wavefunction 412 penetrates only slightly (e.g., do not penetrate deep) into the phase-change material, the first superconducting wavefunction 410 and the second superconducting wavefunction 412 do not overlap and therefore, the phase-change material will not have a continuous portion of region from the first superconducting transmission line 406 to the second superconducting transmission line 408 that exhibits superconductivity, thereby preventing the phase-change material from superconducting.

When the switch portion 404 is in a first state (e.g., the first state explained above with respect to FIG. 2), the phase-change material is in the crystalline physical state (e.g., a low resistive state) and therefore, the first superconducting wavefunction 410 and the second superconducting wavefunction 412 penetrates deep into the phase-change material 110. Further, when the switch portion 404 is in a second state (e.g., the second state explained above with respect to FIG. 2), the phase-change material is in the amorphous physical state (e.g., a high resistive state) and therefore, the first superconducting wavefunction 410 and the second superconducting wavefunction 412 penetrates only slightly (e.g., do not penetrate deep) into the phase-change material. In some examples, a length of the switch portion 404 (in particular, the phase-change material) that extends between the first superconducting transmission line 406 and the second superconducting transmission line 408 is configured to be greater than a predefined minimum threshold length Lmin and less than a predefined maximum threshold length Lmax, to facilitate the phase-change material to propagate (e.g., in a superconducting state) an input signal IN from the first superconducting transmission line 406 to the second superconducting transmission line 408 in the first state of the switch portion 404 and to prohibit the propagation of the input signal IN from the first superconducting transmission line 406 to the second superconducting transmission line 408 in the second state of the switch portion 404.

For example, when the length of the switch portion 404 becomes equal to or lesser than the predefined minimum threshold length Lmin, even if the first superconducting wavefunction 410 and the second superconducting wavefunction 412 penetrates only slightly into the phase-change material in the second state of the switch portion 404, the reduced length of the phase-change material causes the first superconducting wavefunction 410 and the second superconducting wavefunction 412 to overlap in the second state (e.g., the high-resistive state) of the switch portion 404. In other words, when the length of the switch portion 404 becomes equal to or lesser than the predefined minimum threshold length Lmin, the first superconducting wavefunction 410 and the second superconducting wavefunction 412 always overlap, thereby making the phase-change material superconduct both in the first state and the second state of the switch portion 404.

Further, when the length of the switch portion 404 becomes equal to or greater than the predefined maximum threshold length Lmax, even if the first superconducting wavefunction 410 and the second superconducting wavefunction 412 penetrates deep into the phase-change material in the first state (e.g., the low-resistive state) of the switch portion 404, the increased length of the phase-change material prevents the first superconducting wavefunction 410 and the second superconducting wavefunction 412 from overlapping. In other words, when the length of the switch portion 404 becomes equal to or greater than the predefined maximum threshold length Lmax, the first superconducting wavefunction 410 and the second superconducting wavefunction 412 never overlap, thereby making the phase-change material not superconduct both in the first state and the second state of the switch portion 404. In the first state of the switch portion 404, the phase-change material would still conduct electrically but with a finite resistance based on the phase change material's normal-state resistance. With overlapping proximity effects, the phase-change material becomes a lossless superconductor, but when the normal-state conductivity is present the phase-change material will exhibit signal loss. In some examples, the predefined minimum threshold length Lmin and the predefined maximum threshold length Lmax varies with the type of non-superconducting material that is utilized to form the phase-change material.

In this example, the length $L_{PC}$ of the switch portion 404 is configured to be between Lmin and Lmax, and therefore the phase-change material superconducts the input signal IN from the first superconducting transmission line 406 to the second superconducting transmission line 408 in the first state of the switch portion 404 and prohibits the propagation of the input signal IN from the first superconducting transmission line 406 to the second superconducting transmission line 408 in the second state of the switch portion 404.

Figure 5:
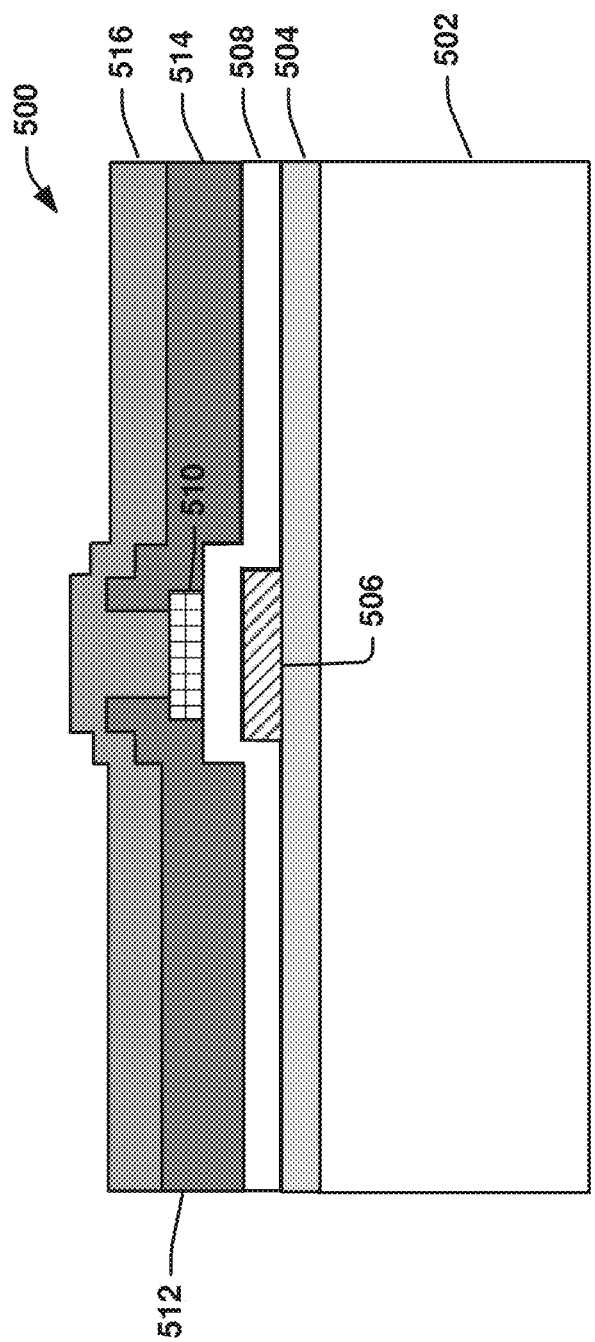
FIG. 5 is an example schematic cross-sectional illustration of a switch circuit.

FIG. 5 is an example of a schematic cross-sectional illustration of a switch circuit 500. The switch circuit 500 can be same as the switch circuit 100 in FIG. 1. In some examples, the switch circuit 500 is implemented as an integrated circuit (IC). The switch circuit 500 includes an insulating layer 504 overlying a substrate 502. The substrate 502 can be formed of a variety of mechanically supportive, insulating, semiconducting and/or conducting materials, such as, but not limited to, silicon carbide (SiC), silicon (Si), gallium arsenide (GaAs), aluminum oxide ($Al_2O_3$), aluminum nitride (AlN), quartz ($SiO_2$), germanium (Ge), gallium nitride (GaN), indium phosphide (InP), silicon-on-insulator (SOI), silicon-on-sapphire (SOS), and silicon germanium (SiGe). The switch circuit 500 could also be added directly to another device wafer (e.g., CMOS, SiGe, BiCMOS, RF-CMOS) with preexisting circuits, including MMICs, ASICs, or RFICs. The insulating layer 504 electrically isolates a resistive heating material 506, corresponding to at least a portion of the actuation portion 112 of the phase-change material switch 106 in the example of FIG. 1, from the substrate 502 and also determines the thermal resistance from the resistive heating material 506 to the substrate 502. The insulating layer 504 can be formed of silicon dioxide ($SiO_2$), aluminum nitride (AlN), aluminum oxide ($Al_2O_3$), silicon nitride (SiN) or a variety of other electrically insulating materials.

Figure 6:
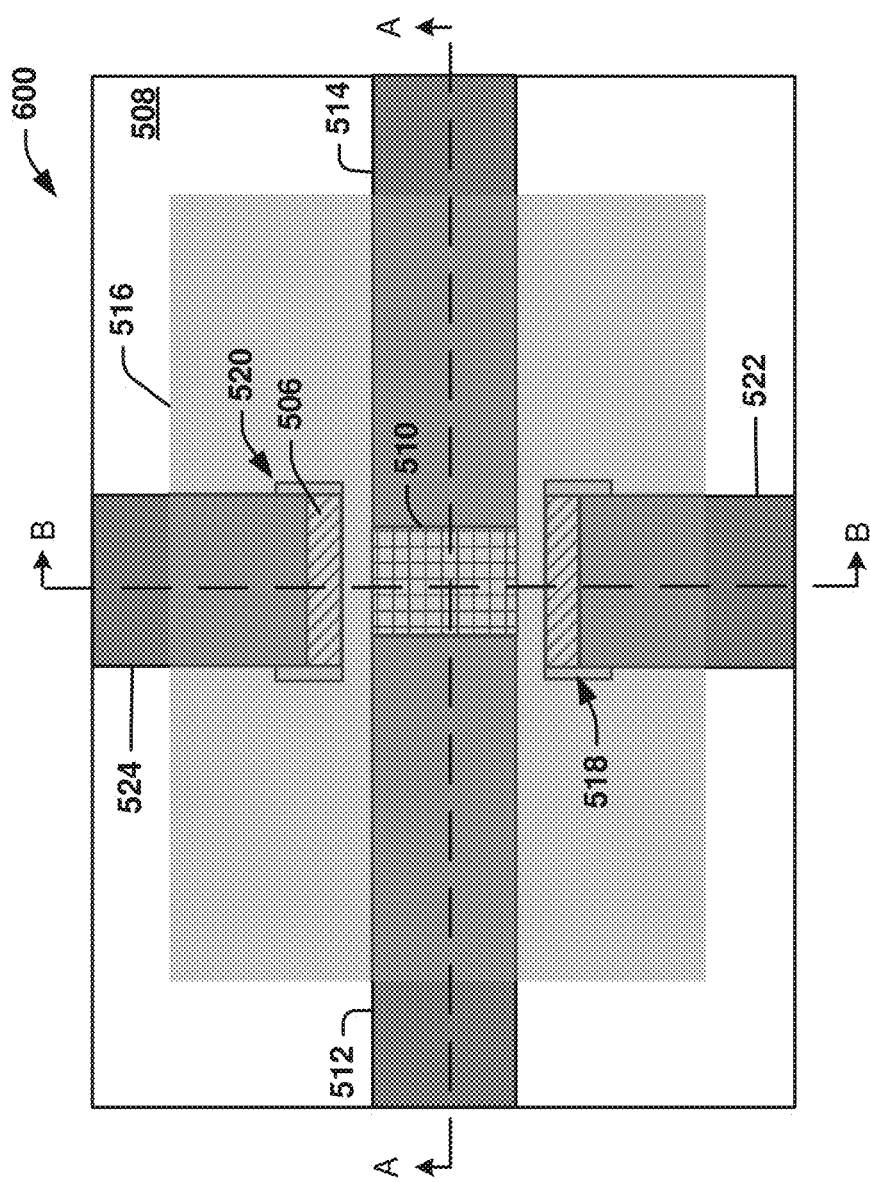
FIG. 6 depicts an example of a plan view of the switch circuit in FIG. 5.

The resistive heating material 506 overlies the insulating layer 504 and a barrier layer 508 overlies the resistive heating material 506. A phase-change material 510 corresponding to the phase-change material 110 of the switch portion 108 in the example of FIG. 1, overlies the barrier layer 508 and is positioned above the resistive heating material 506, such that heat from the resistive heating material 506 can pass through the barrier layer 508 to the phase-change material 510. FIG. 6 depicts an example of a plan view 600 of the switch circuit 500 in FIG. 5 and therefore, same numbering is used herein to depict the same structure. As shown in the top view 600 of FIG. 6, the barrier layer 508 includes a first opening 518 from which a first control line 522 is coupled to a first end of the resistive heating material 506 and a second opening 520 in which a second control line 524 is connected to a second end of the resistive heating material 506.

Referring back to FIG. 5, the resistive heating material 506 can include, for example, a metal or metal alloy material that exhibits resistivity and a substantially high thermal conductivity. For example, the resistive heating material 506 can be formed from nickel chromium silicon (NiCrSi), nickel chromium (NiCr), Tungsten (W), titanium-tungsten (TiW), platinum (Pt), tantalum (Ta), molybdenum (Mo), niobium (Nb), or iridium (Ir), or any of a variety of or a combination of similar metal or metal alloys that have the above properties and have a melting temperature that is higher than the melting temperature of the PCM 510.

The barrier layer 508 (e.g., a dielectric layer) is an electrical insulator that is thermally conductive such that the barrier layer 508 electrically insulates the resistive heating material 506 from the phase-change material 510, but allows heat from the resistive heating material 506 to pass through the barrier layer 508 to the PCM 510 to change the state of the phase-change material 510 between a crystallized physical state in response to a first heat profile and an amorphous physical state in response to a second heat profile. The barrier layer 508 can be formed of SiN, AlN, $SiO_2$, silicon carbide (SiC), diamond (C) or other barrier material having the properties discussed above.

As can be seen in FIG. 5 and FIG. 6, a first superconducting transmission line 512 extends from a first end/side of the phase-change material 510 and a second superconducting transmission line 514 extends from a second end/side of the phase-change material 510. The first and second control lines 522 and 524, and the first and second superconducting transmission lines 512 and 514 can be formed from one or more metal layers. In the example of FIGS. 5 and 6, a quench layer 516 overlies a portion of the control lines 522-524, the superconducting transmission lines 512-514, the phase-change material 510 and portions of the resistive heating material 506. The quench layer 516 can be formed from a variety of thermally conductive materials, such as AlN, Si, SiC, or diamond to provide rapid cooling of the phase-change material 510 to facilitate the phase-change material 510 between the crystalline physical state and the amorphous physical state via a control signal CTRL being provided through the resistive heating material 506. As an example, the quench layer 516 can be formed as a top, and thus final layer, with respect to the wafer during fabrication of the switch circuit 500. As a result, the quench layer 516 can be provided without any finishing steps (e.g., polishing, etching, etc.), thus providing for a more cost-effective and efficient fabrication process with respect to adding the quench layer 516 to the switch circuit 500.

Figure 7:
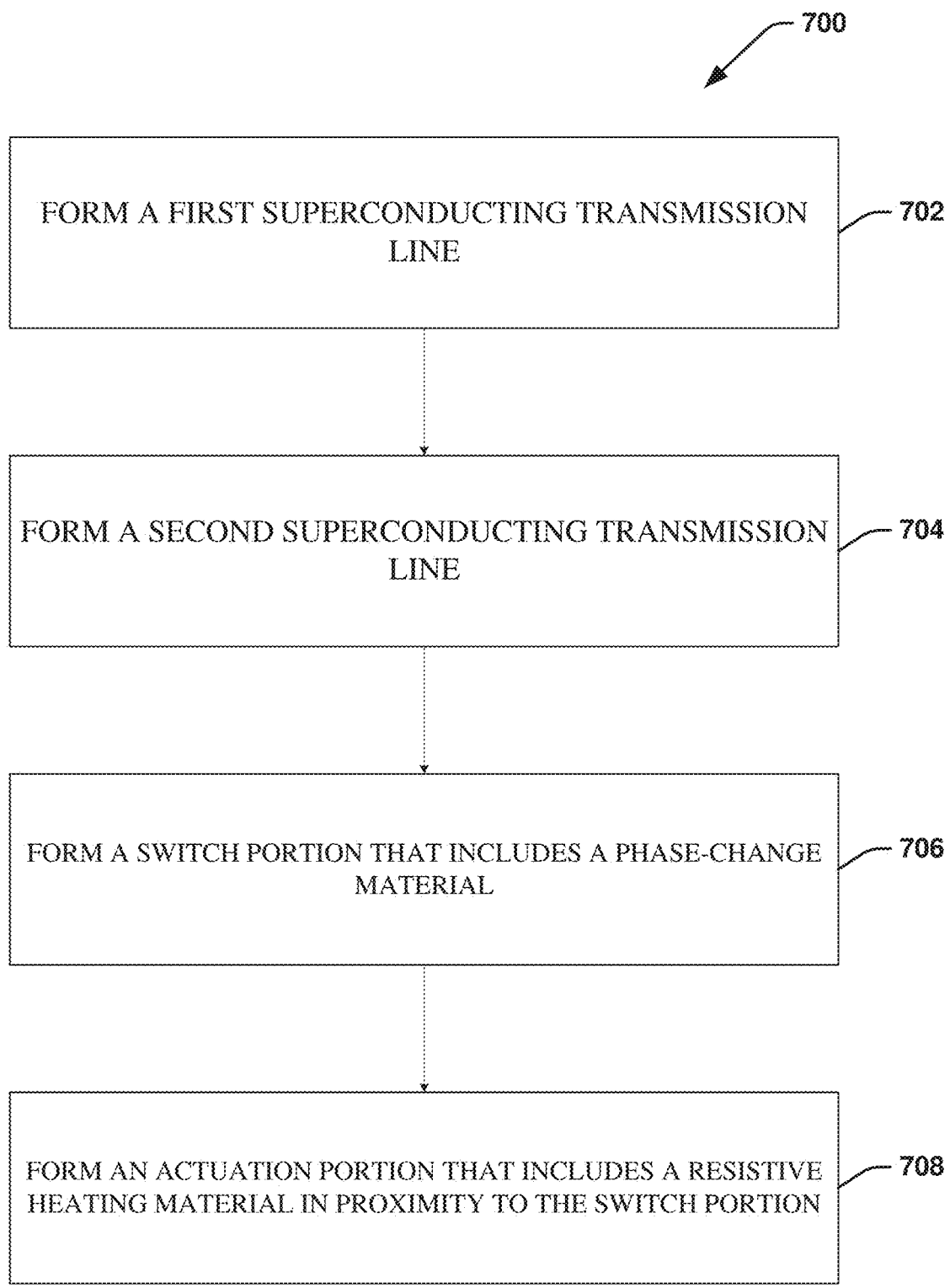
FIG. 7 illustrates an example method of fabricating a switch circuit.

FIG. 7 illustrates an example method 700 of fabricating a switch circuit. The method 700 is applicable to fabricating the switch circuit 100 of FIG. 1 and is therefore, explained herein with reference to FIG. 1. At 702, a first superconducting transmission line (e.g., the first superconducting transmission line 102 in FIG. 1) is formed. At 704, a second superconducting transmission line (e.g., the second superconducting transmission line 104 in FIG. 1) is formed. At 706, a switch portion (e.g., the switch portion 108 in FIG. 1) that includes a phase-change material (e.g., the phase-change material 110 in FIG. 1) is formed. The switch portion has an input side that is coupled to the first superconducting transmission line and an output side that is coupled to the second superconducting transmission line. The switch portion comprising a phase-change material that is configured to propagate an input signal from the first superconducting transmission line to the second superconducting transmission line in a first state of the switch portion, and to prohibit propagation of the input signal from the first superconducting transmission line to the second superconducting transmission line in a second state of the switch portion.

At 708, an actuation portion (e.g., the actuation portion 112 in FIG. 1) that includes a resistive heating material is formed near to the switch portion. The actuation portion is configured to provide a first heat profile to the phase-change material to toggle the switch portion to the first state and to provide a second heat profile to the phase-change material to toggle the switch portion to the second state. In some examples, the actuation portion can be formed before forming the switch portion.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A switch circuit, comprising:
   a first superconducting transmission line;
   a second superconducting transmission line; and
   a phase-change material switch that is coupled between the first and second superconducting transmission lines, the phase-change material switch comprising a switch portion that includes a phase-change material that is superconducting in a first state of the switch portion and blocking in a second state of the switch portion, such that the phase change material switch is configured to propagate an input signal from the first superconducting transmission line to the second superconducting transmission line in the first state, and to prohibit propagation of the input signal from the first superconducting transmission line to the second superconducting transmission line in the second state.

2. The switch circuit of claim 1, wherein the phase-change material switch further comprises an actuation portion in proximity to the switch portion and configured to toggle the switch portion between the first state and the second state.

3. The switch circuit of claim 2, wherein the phase-change material is formed from a superconducting material.

4. The switch circuit of claim 3, wherein the superconducting material comprises an alloy of tin telluride (SnTe) and germanium telluride (GeTe).

5. The switch circuit of claim 4, wherein the superconducting material includes at most 70% SnTe and at least 30% GeTe.

6. The switch circuit of claim 2, wherein the phase-change material is formed from a non-superconducting material.

7. The switch circuit of claim 6, wherein the switch portion has a length between the first and second superconducting transmission lines that is less than a predefined maximum threshold length to facilitate the phase-change material to exhibit superconductivity in the first state based on a proximity effect.

8. The switch circuit of claim 2, wherein the actuation portion is configured to receive a control signal and emit a first heat profile in response to first characteristics of the control signal and a second heat profile in response to second characteristics of the control signal, and wherein the switch portion is toggled to the first state in response to the first heat profile and to the second state in response to the second heat profile.

9. The switch circuit of claim 8, wherein the first state corresponds to the phase-change material being set to a crystalline physical state in response to the first heat profile, and wherein the second state corresponds to the phase-change material being set to an amorphous physical state in response to the second heat profile.

10. The switch circuit of claim 1, wherein the switch portion is configured as an inline switch, such that the phase-change material is substantially in-line with the first superconducting transmission line at an input side of the switch portion and the phase-change material is substantially in-line with the second superconducting transmission line at an output side of the switch portion.

11. A method for fabricating a switch circuit, comprising:
    forming a first superconducting transmission line;
    forming a second superconducting transmission line;
    forming a switch portion having an input side that is coupled to the first superconducting transmission line and an output side that is coupled to the second superconducting transmission line, the switch portion comprising a phase-change material that is configured to propagate an input signal from the first superconducting transmission line to the second superconducting transmission line in a first state of the switch portion that corresponds to a superconducting state of the phase-change material, and to prohibit propagation of the input signal from the first superconducting transmission line to the second superconducting transmission line in a second state of the switch portion that corresponds to a blocking state of the phase-change material; and
    forming an actuation portion that includes a resistive heating material near to the switch portion and configured to provide a first heat profile to the phase-change material to toggle the switch portion to the first state and to provide a second heat profile to the phase-change material to toggle the switch portion to the second state.

12. The method of claim 11, wherein the phase-change material is formed from a superconducting material.

13. The method of claim 12, wherein the superconducting material comprises an alloy of tin telluride (SnTe) and germanium telluride (GeTe).

14. The method of claim 11, wherein the phase-change material is formed from a non-superconducting material.

15. The method of claim 14, wherein the switch portion has a length between the first and second superconducting transmission lines that is less than a predefined maximum threshold length to facilitate the phase-change material to exhibit superconductivity in the first state based on a proximity effect.

16. A switch circuit, comprising:
    a first superconducting transmission line;
    a second superconducting transmission line; and
    a phase-change material switch comprising:
      a switch portion having an input side that is coupled to the first superconducting transmission line and an output side that is coupled to the second superconducting transmission line, the switch portion including a phase-change material that is superconducting in a first state of the switch portion and blocking in a second state of the switch portion, such that the phase change material switch is configured to propagate an input signal from the first superconducting transmission line to the second superconducting transmission line in the first state, and to prohibit propagation of the input signal from the first superconducting transmission line to the second superconducting transmission line in the second state; and
      an actuation portion near to the switch portion and configured to provide a first heat profile to the phase-change material to toggle the switch portion to the first state and to provide a second heat profile to the phase-change material to toggle the switch portion to the second state.

17. The switch circuit of claim 16, wherein the phase-change material is formed from a superconducting material.

18. The switch circuit of claim 17, wherein the superconducting material comprises an alloy of tin telluride (SnTe) and germanium telluride (GeTe).

19. The switch circuit of claim 16, wherein the phase-change material is formed from a non-superconducting material, wherein the switch portion has a length between the first and second superconducting transmission lines that is less than a predefined maximum threshold length to facilitate the phase-change material to exhibit superconductivity in the first state based on the proximity effect.

20. The switch circuit of claim 16, wherein the actuation portion is configured to receive a control signal and provide the first heat profile in response to first characteristics of the control signal to set the phase-change material to a crystalline physical state to toggle the switch portion to the first state, and to provide the second heat profile in response to second characteristics of the control signal to set the phase-change material to an amorphous physical state to toggle the switch portion to the second state.

* * * * *